(12) United States Patent
Onuki (10) Patent No.: US 12,211,867 B2
(45) Date of Patent: Jan. 28, 2025

(54) PHOTOELECTRIC CONVERSION APPARATUS, PHOTOELECTRIC CONVERSION SYSTEM, MOVING BODY, AND SEMICONDUCTOR SUBSTRATE

(71) Applicant: CANON KABUSHIKI KAISHA, Tokyo (JP)

(72) Inventor: Yusuke Onuki, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 381 days.

(21) Appl. No.: 17/709,112

(22) Filed: Mar. 30, 2022

(65) Prior Publication Data

US 2022/0320164 A1 Oct. 6, 2022

(30) Foreign Application Priority Data

Apr. 2, 2021 (JP) .................... 2021-063491

(51) Int. Cl.
 *H01L 27/146* (2006.01)
 *B60R 1/24* (2022.01)
(52) U.S. Cl.
 CPC .. *H01L 27/14623* (2013.01); *H01L 27/14605* (2013.01); *B60R 1/24* (2022.01)
(58) Field of Classification Search
 CPC ... H01L 27/146–14893; H01L 2933/00–0091; H01L 33/00–648; H01L 27/15–156; H10K 50/00–88
 See application file for complete search history.

(56) References Cited

U.S. PATENT DOCUMENTS

2020/0035722 A1* 1/2020 Toyoguchi .......... H01L 27/1461
2020/0312893 A1* 10/2020 Seto .................. H01L 27/14643

FOREIGN PATENT DOCUMENTS

| JP | 2006-344888 A | 12/2006 |
| JP | 2018107409 A | 7/2018 |
| JP | 2020-021775 A | 2/2020 |

* cited by examiner

*Primary Examiner* — Evren Seven
*Assistant Examiner* — Cole Leon Lindsey
(74) *Attorney, Agent, or Firm* — Canon U.S.A., Inc. IP Division (57) ABSTRACT

An apparatus includes a plurality of pixels arranged in a substrate including a first surface provided with a transistor and a second surface opposed to the first surface, and a light shielding portion. The plurality of pixels includes first pixels shielded from light, and second pixels. Each of the plurality of pixels includes a first area of a first conductive type. Each of the first pixels includes a second area. Each of the second pixels includes a third area between the second surface and the first area, and includes a fourth area of a second conductive type between the first area and the first surface. In a cross-section along a first line, an impurity concentration of the first conductive type in the second area is higher than an impurity concentration of the first conductive type in the third area.

20 Claims, 8 Drawing Sheets

PHOTOELECTRIC CONVERSION APPARATUS, PHOTOELECTRIC CONVERSION SYSTEM, MOVING BODY, AND SEMICONDUCTOR SUBSTRATE

BACKGROUND

Technical Field

The aspect of the embodiments relates to a photoelectric conversion apparatus, a photoelectric conversion system, a moving body using the photoelectric conversion system, and a semiconductor substrate.

Description of the Related Art

Japanese Patent Application Laid-Open No. 2018-107409 discusses a photoelectric conversion apparatus provided with a pixel that includes, below a charge accumulation area, a depletion suppression layer suppressing expansion of a depletion layer, in order to increase a saturation charge amount or to prevent a white spot.

To obtain a reference value of a noise level in a pixel, a reference pixel not including a charge accumulation area is disposed in a light shielded area in some cases. In the image capturing apparatus in which a pixel including a depletion suppression layer is disposed in an effective pixel area, charges are accumulated, in some cases, in a semiconductor area deep in a photodiode in the reference pixel not including the charge accumulation area. If the charges accumulated in the semiconductor area of the reference pixel leak into an adjacent pixel, accuracy of a signal output from the pixel may be decreased and image quality may be deteriorated.

In Japanese Patent Application Laid-Open No. 2018-107409, however, the reference pixel to obtain the reference value of the noise level is not examined.

SUMMARY

According to an aspect of the embodiments, an apparatus includes a plurality of pixels arranged in a substrate including a first surface provided with a transistor and a second surface opposed to the first surface, and a light shielding portion configured to shield a part of the plurality of pixels from light. The plurality of pixels includes first pixels shielded from light by the light shielding portion, and second pixels. Each of the plurality of pixels includes a first area of a first conductive type. Each of the first pixels includes a second area. Each of the second pixels includes a third area between the second surface and the first area, and includes a fourth area of a second conductive type between the first area and the first surface. A first line parallel to the second surface is defined at a position dividing each of the second area and the third area, between the second surface and the first area in each of the first and second pixels. In a cross-section along the first line, an impurity concentration of the first conductive type in the second area is higher than an impurity concentration of the first conductive type in the third area.

According to another aspect of the embodiments, an apparatus includes a plurality of pixels arranged in a substrate including a first surface provided with a transistor and a second surface opposed to the first surface, and a light shielding portion configured to shield a part of the plurality of pixels from light. The plurality of pixels includes first pixels shielded from light by the light shielding portion, and second pixels. Each of the plurality of pixels includes a first area of a first conductive type, and a fifth area. Each of the first pixels includes a second area. Each of the second pixels includes a third area and a fourth area. The first area includes a first end and a second end that faces the first end and is distanced by the fifth area. A first distance of the first area of each of the first pixels distanced by the fifth area is greater than a second distance of the first area of each of the second pixels distanced by the fifth area. A first line parallel to the second surface is defined at a position dividing each of the second area and the third area, between the second surface and the first area in each of the first and second pixels. A second line parallel to the second surface is defined at a position dividing each of the second area and the fourth area, between the first surface and the first area. A third line parallel to the second surface is defined at a position dividing each of the first area and the second area, between the first line and the second line. In a cross-section along the first line, the second area and the third area are of a second conductive type. In a cross-section along the second line, the second area and the fourth area are of the second conductive type. In a cross-section along the third line, the second area is of the second conductive type.

Further features of the disclosure will become apparent from the following description of exemplary embodiments with reference to the attached drawings.

DESCRIPTION OF THE EMBODIMENTS

Some exemplary embodiments about a photoelectric conversion apparatus and a method of driving the photoelectric conversion apparatus according to the disclosure will be described in detail below with reference to drawings. In the exemplary embodiments described below, an image capturing apparatus is mainly described as an example of the photoelectric conversion apparatus; however, the exemplary embodiments are not limited to the image capturing apparatus and are applicable to other examples of the photoelectric conversion apparatus. The other examples of the photoelectric conversion apparatus include a ranging apparatus (apparatus for distance measurement using focus detection and time of flight (TOF)), and a photometric apparatus (apparatus for measurement of incident light quantity).

Further, semiconductor areas, conductive types of a well, and dopants to be implanted described in the following exemplary embodiments are illustrative, and the conductive types and the dopants are not limited only to the conductive types and the dopants described in the exemplary embodiments. The conductive types and the dopants described in the exemplary embodiments can be appropriately changed, and the semiconductor areas and potentials of the well are accordingly appropriately changed.

In the following description, a surface provided with a transistor, of a semiconductor substrate on which pixels are formed is referred to as a front surface or an upper surface, and a surface opposed to the front surface is referred to as a rear surface or a lower surface. In the following description, a pixel to which light enters from a rear surface side (Back-side Illumination type) is described as an example; however, the structure of the pixel is not limited thereto, and the aspect of the embodiments is applicable to a pixel to which light enters from a front surface side (front-surface irradiation type).

An impurity concentration described in the following exemplary embodiments indicates an effective impurity concentration unless otherwise noted. In a case where both of a donor and an acceptor are implanted into the semiconductor area, a difference between the implanted impurity amounts is regarded as the effective impurity concentration for the semiconductor area.

A first exemplary embodiment of the disclosure will now be described with reference to FIG. 1 to FIG. 5D.

Figure 1:
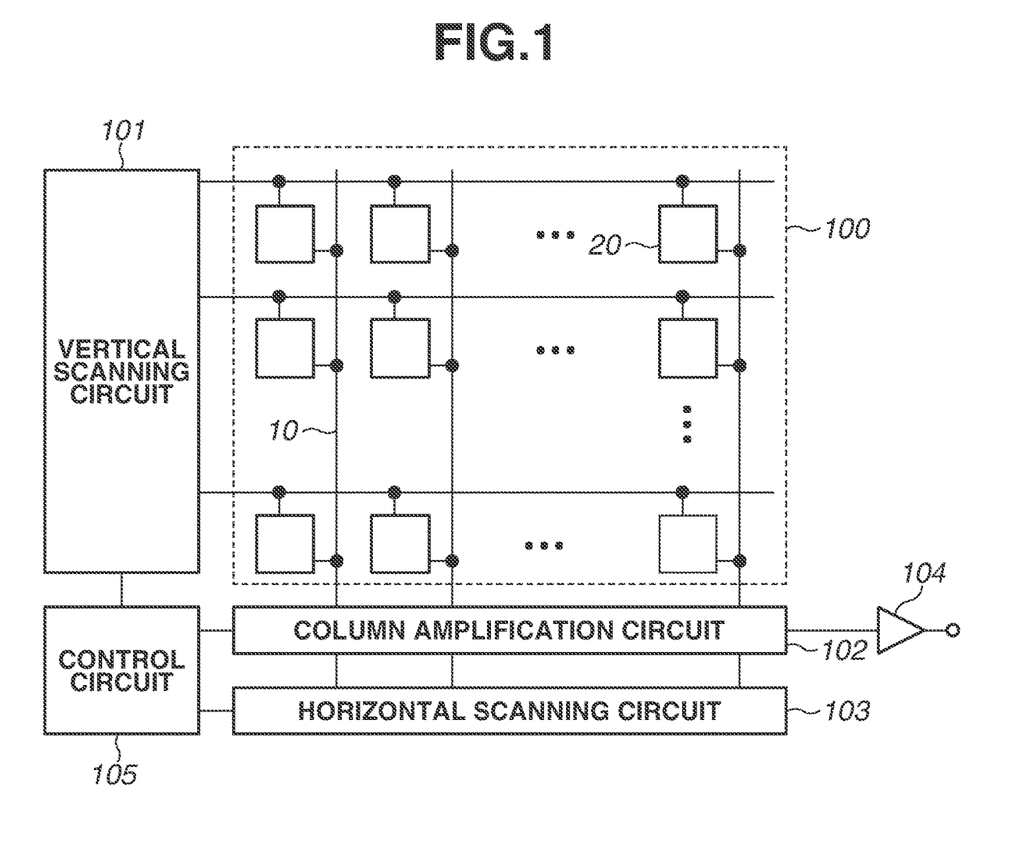
FIG. 1 is a schematic diagram of a photoelectric conversion apparatus according to a first exemplary embodiment.

FIG. 1 is a schematic diagram illustrating a schematic configuration of a photoelectric conversion apparatus according to the present exemplary embodiment.

The photoelectric conversion apparatus includes a pixel array 100, a vertical scanning circuit 101, a column amplification circuit 102, a horizontal scanning circuit 103, an output circuit 104, and a control circuit 105 as illustrated in FIG. 1.

The pixel array 100 includes a plurality of unit pixels 20 arranged in an XY matrix shape. The number of the pixels configuring the pixel array 100 is not limited. For example, the pixel array 100 may be configured by pixels arranged in thousands of rows and thousands of columns like a common digital camera, or the pixel array 100 may be configured by a plurality of pixels arranged in one row or one column. Each of the plurality of unit pixels 20 arranged in the pixel array 100 is an effective pixel to which light enters.

The vertical scanning circuit 101 supplies a control signal to turn on or off a transistor of each of the unit pixels 20. A logic circuit, such as a shift register and an address decoder, may be used for the vertical scanning circuit 101. A vertical output line 10 is provided for each column of the unit pixels 20, and signals from the unit pixels 20 in each column are read out to the corresponding vertical output line 10.

The column amplification circuit 102 amplifies pixels signals output to the vertical output lines 10, and performs correlated double sampling processing based on a signal at reset and a signal at photoelectric conversion.

The horizontal scanning circuit 103 includes switches connected to amplifiers of the column amplification circuit 102, and supplies a control signal to turn on or off each of the switches.

The output circuit 104 includes a buffer amplifier or a differential amplifier, and outputs the pixel signals from the column amplification circuit 102 to a signal processing unit outside the photoelectric conversion apparatus. An analog-to-digital (AD) conversion unit may be provided in the photoelectric conversion apparatus, and a digital pixel signal may be output.

Figure 2:
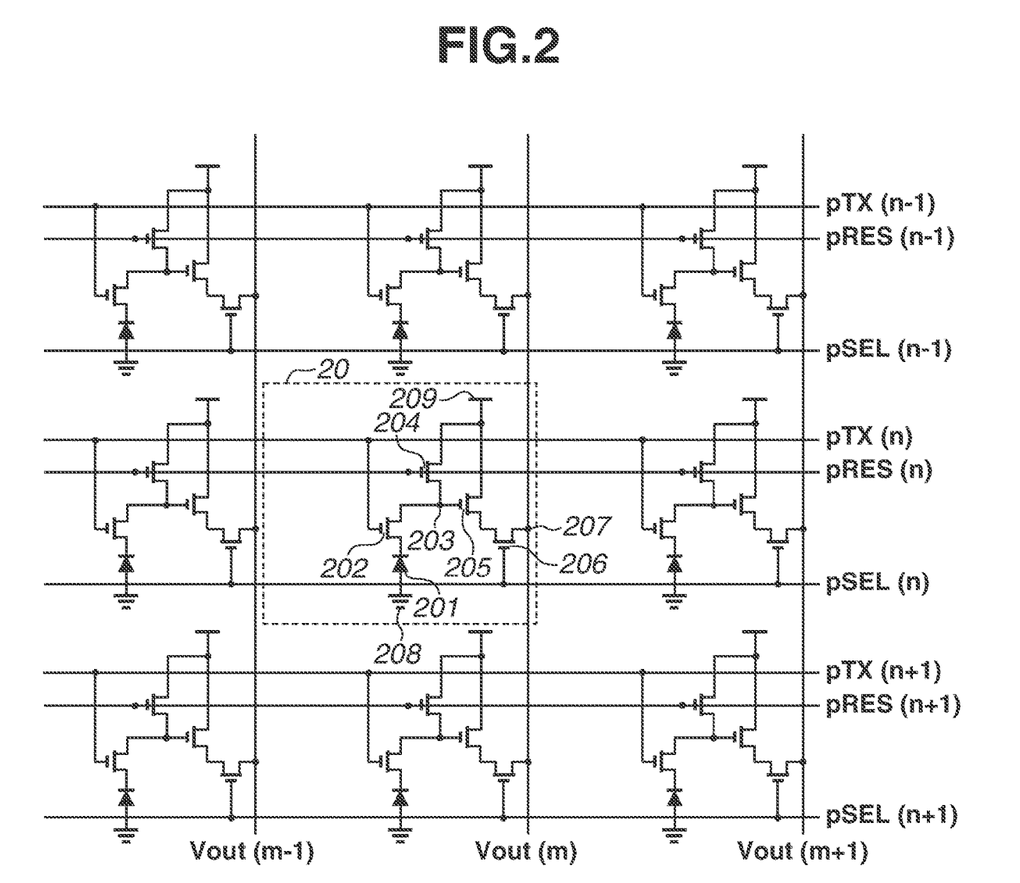
FIG. 2 is a pixel circuit diagram of the photoelectric conversion apparatus according to the first exemplary embodiment.

FIG. 2 illustrates an equivalent circuit of the unit pixels 20 to explain the photoelectric conversion apparatus according to the present exemplary embodiment. FIG. 2 illustrates nine unit pixels 20 arranged in three rows and three columns among the plurality of unit pixels 20 two-dimensionally arranged in the row direction and the column direction.

Each of the plurality of unit pixels 20 includes a photoelectric conversion unit (hereinafter, also referred to as photodiode (PD)) 201, a transfer transistor 202, and a floating diffusion (hereinafter, also referred to as FD) 203. Each of the plurality of unit pixels 20 further includes a reset transistor 204, an amplification transistor 205, and a selection transistor 206. Each of the plurality of unit pixels 20 further includes an output unit 207 connected to the corresponding vertical output line 10, a ground 208, and a power supply 209.

The PD 201 photoelectrically converts incident light, and accumulates charges derived from the photoelectric conversion.

The transfer transistor 202 transfers the charges of the PD 201 to the FD 203 by being turned on.

The amplification transistor 205 configures a source follower circuit with a current source (not illustrated) connected to the corresponding vertical output line 10. As a result, the amplification transistor 205 outputs a signal based on a voltage of the FD 203, to the corresponding vertical output line 10 through the selection transistor 206. Further, turning on the reset transistor 204 can reset the voltage of the FD 203 with a voltage of the power supply 209.

The vertical scanning circuit 101 supplies a common control signal to the unit pixels 20 in the same row. In other words, controls signals pTX(n), pRES(n), and pSEL(n) are respectively supplied to the transfer transistors 202, the reset transistors 204, and the selection transistors 206 in the n-th row. These transistors are turned on when the control signals are at a high level, and are turned off when the control signals are at a low level.

Figure 3:
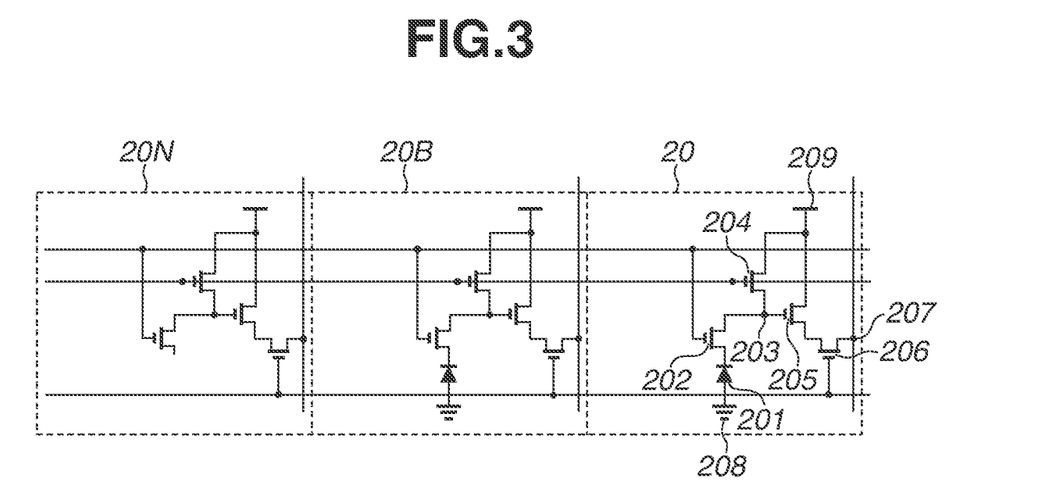
FIG. 3 is a pixel circuit diagram of the photoelectric conversion apparatus according to the first exemplary embodiment.

FIG. 3 illustrates an equivalent circuit of each of a unit pixel 20, an optical black (OB) pixel 20B, and a reference pixel 20N of the photoelectric conversion apparatus according to the present exemplary embodiment.

The devices included in the unit pixel 20 and functions thereof are the same as the devices and the functions described with reference to FIG. 2. Light entering the unit pixel 20 is converted into a signal by the PD 201.

Although the OB pixel 20B has the device structure same as the device structure of the unit pixel 20, the OB pixel 20B includes a light shielding portion (not illustrated) limiting entering of light, on a light incident surface side of the pixel. Thus, the PD 201 of the OB pixel 20B does not perform photoelectric conversion of the incident light, and a reference value of a black level having a dark current or noise of the PD 201 can be obtained as an output of the OB pixel 20B.

The reference pixel 20N does not include the PD 201 unlike the unit pixel 20 and the OB pixel 20B. A signal output from the reference pixel 20N is thereby not influenced by the dark current or the noise of the PD. A reference value of a noise at the pixel unit not including dark current or noise of the PD can be obtained as an output of the reference pixel 20N.

Figure 4A:
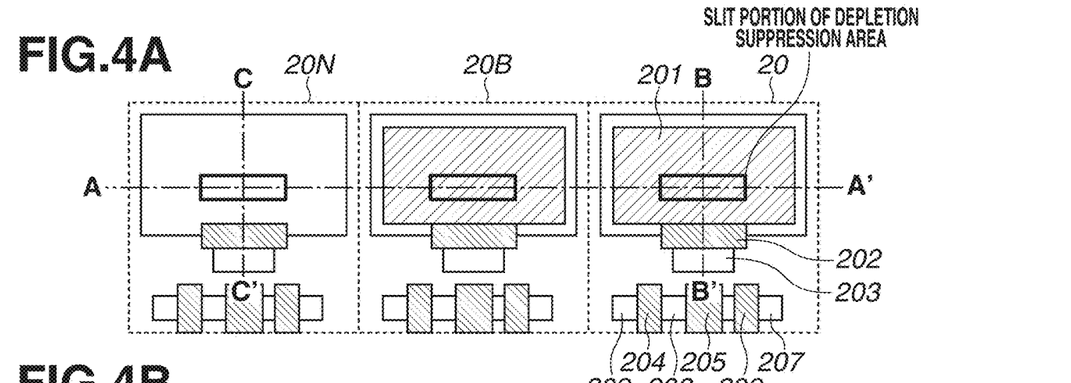
FIGS. 4A to 4D are a pixel plan view and cross-sectional views of a photoelectric conversion apparatus according to a comparative example.
Figure 4B:
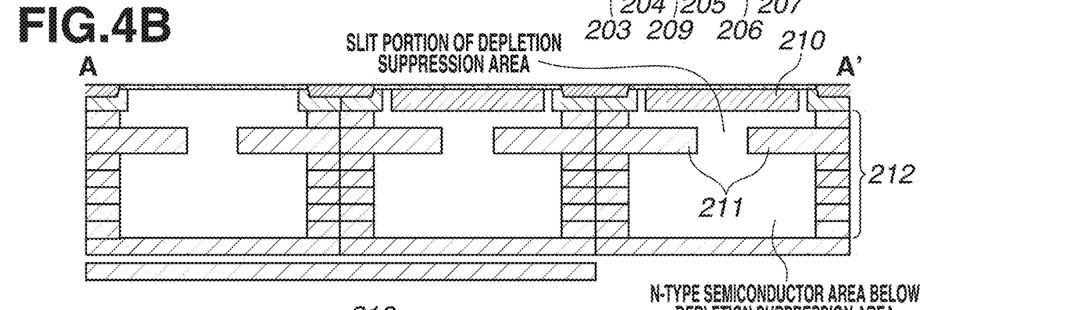

FIG. 4A is a schematic plan view of three pixels, i.e., the unit pixel 20, the OB pixel 20B, and the reference pixel 30N, of a photoelectric conversion apparatus according to a comparative example. FIG. 4B is a schematic cross-sectional view of the three-pixels taken along the line A-A' illustrated in FIG. 4A.

The devices included in each of the unit pixel 20, the OB pixel 20B, and the reference pixel 20N and the functions thereof are the same as the devices and the functions described with reference to FIG. 2 and FIG. 3. Rectangular areas illustrated by thick lines in FIG. 4A are slit portions of a depletion suppression area 211 in FIG. 4B described below. FIG. 4B schematically illustrates a light shielding film to shield light that is provided on the light incident surface side of each of the OB pixel 20B and the reference pixel 20N.

Figure 4C:
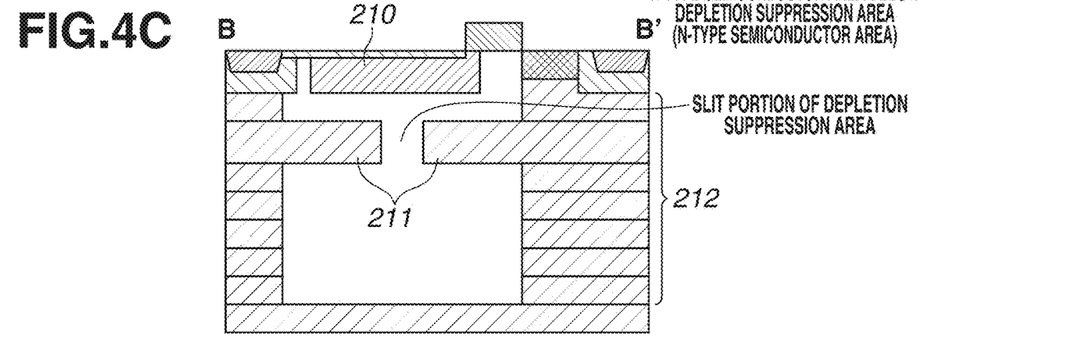
Figure 4D:
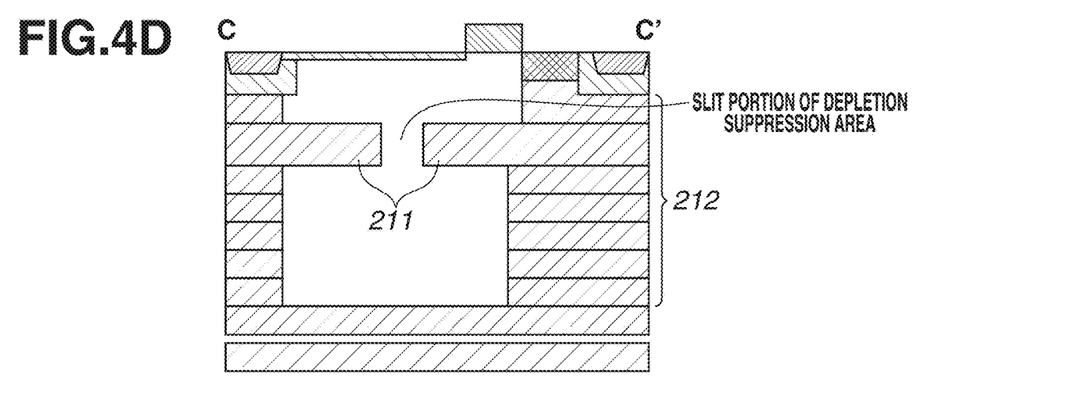

FIG. 4C is a schematic cross-sectional view taken along the line B-B' illustrated in FIG. 4A. FIG. 4D is a schematic cross-sectional view taken along the line C-C' illustrated in FIG. 4A. As illustrated in FIGS. 4B and 4C, the unit pixel 20 and the OB pixel 20B each include an N-type charge accumulation area 210, a P-type depletion suppression area 211, and a pixel separation area 212.

In each of the unit pixel 20 and the OB pixel 20B included in the photoelectric conversion apparatus according to the comparative example, the P-type depletion suppression area 211 to suppress expansion of a depletion layer is provided below the N-type charge accumulation area 210. Charges generated in an N-type semiconductor area below the depletion suppression area 211 are collected to the charge accumulation area 210 through the slit portion of the depletion suppression area 211 by drift. In FIG. 4A, the slit portion of the depletion suppression area 211 is illustrated as an independent area in the depletion suppression area of each of the pixels. In FIG. 4B, a first end of the slit portion and a second end facing the first end are distanced at right and left sides in the A-A' cross-section. The structure of the depletion suppression area is not limited thereto. For example, a slit extending over an entire area in the A-A' direction may be formed along the A-A' line. The depletion suppression area of each of the pixels can be configured by a plurality of members.

Since the depletion suppression area 211 is the P-type semiconductor area, a potential barrier is formed at the slit portion in a case where a potential at the slit portion of the depletion suppression area 211 is high. It is considered that the potential barrier inhibits movement of the charges from the N-type semiconductor area to the charge accumulation area 210, and the charges remain in the N-type semiconductor area. In a case where the potential of the slit portion of the depletion suppression area 211 is low and a potential gap is present, it is considered that the charges remain in the slit portion of the depletion suppression area when the transfer transistor 202 is turned on and the charges are transferred from the pixel to the FD 203.

The potential at the slit portion of the depletion suppression area 211 is determined based on a photomask pattern for forming the depletion suppression area 211 and the charge accumulation area 210, an ion implantation condition of the P-type and N-type impurities, and thermal diffusion of the implanted ions. At the slit portion of the depletion suppression area 211 in each of the unit pixel 20 and the OB pixel 20B, a potential gradient is formed from the N-type semiconductor area to the charge accumulation area 210.

In contrast, since the PD 201 is not provided in the reference pixel 20N, ion implantation for forming the charge accumulation area 210 is not performed. In the case where the ion implantation for formation of the charge accumulation area 210 is not performed, a P-type impurity concentration is relatively high at the slit portion of the depletion suppression area 211. In the reference pixel 20N, the potential at the slit portion of the depletion suppression area 211 is therefore high as compared with the unit pixel 20 and the OB pixel 20B each including the charge accumulation area 210. In other words, a potential barrier is formed in the slit portion.

Since the reference pixel 20N does not include the PD 201 and is shielded from light by the light shielding portion, charges by photoelectric conversion are not generated, but charges by the dark current may be generated. In the rear-surface irradiation photoelectric conversion apparatus, a silicon (Si) interface is present on the rear surface side, and thus charges by the dark current are easily generated in the N-type semiconductor area at a position close to the rear surface, as compared with the front-surface irradiation photoelectric conversion apparatus.

The charges generated in the N-type semiconductor area are restrained from moving by the potential barrier formed at the slit portion of the depletion suppression area 211, and the charges are accumulated in the N-type semiconductor area in some cases. The accumulated charges leak into the adjacent pixel (OB pixel or unit pixel) in some cases. Further, if an amount of charges accumulated in the N-type semiconductor area exceeds an amount of charges holdable by the semiconductor area, a part of excessive charges overflows the potential barrier between the reference pixel and the OB pixel 20B, and enters the OB pixel 20B in some cases. If the excessive charges enter the OB pixel 20B, the reference value of the black level cannot be obtained accurately in some cases. Further, the charges leak from the reference pixel 20N to the unit pixel 20 in some cases. In such a case, accuracy of the signal output from the unit pixel 20 is deteriorated. In a case where an image is generated by using the signal output from the photoelectric conversion apparatus, image quality is deteriorated.

Figure 5A:
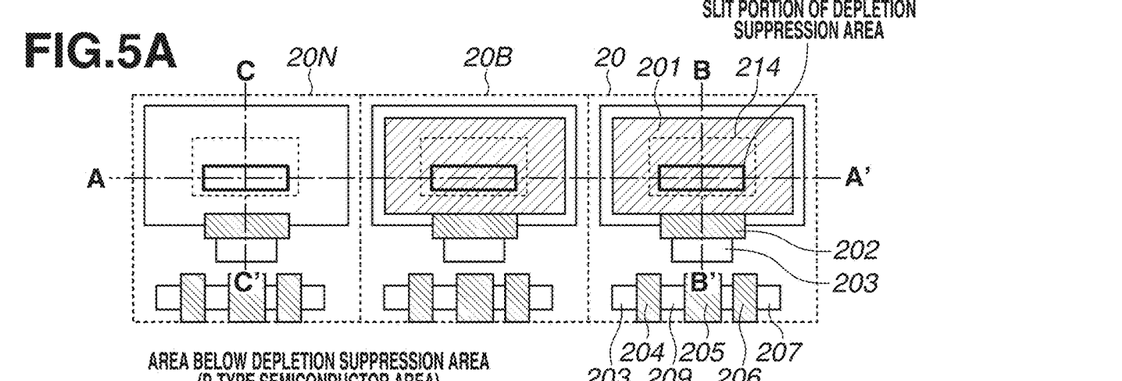
FIGS. 5A to 5D are a pixel plan view and cross-sectional views of the photoelectric conversion apparatus according to the first exemplary embodiment.
Figure 5B:
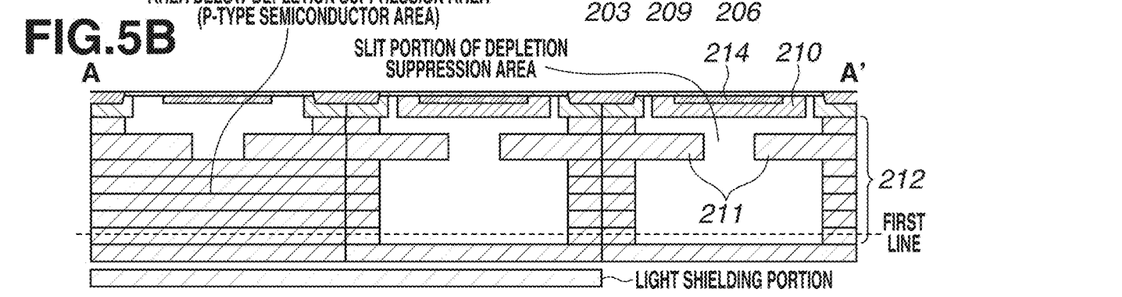
Figure 5C:
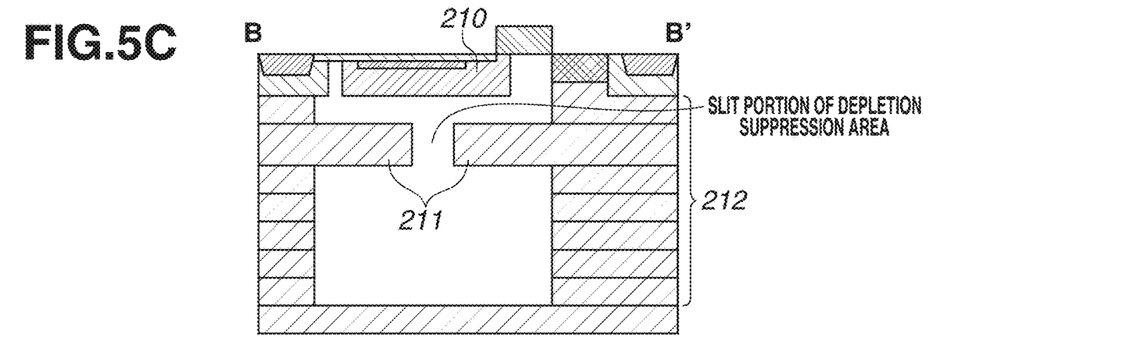
Figure 5D:
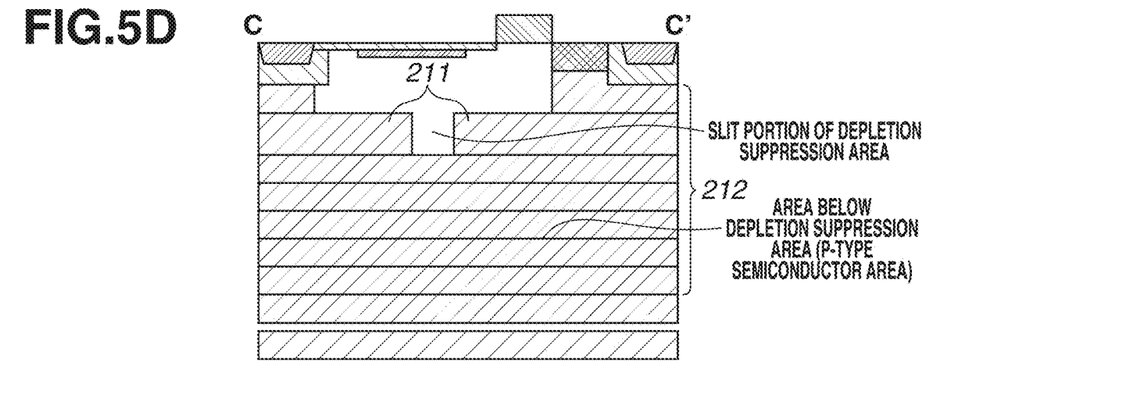

FIGS. 5A to 5D are a schematic plan view and schematic cross-sectional views of the unit pixel 20, the OB pixel 20B, and the reference pixel 20N according to the first exemplary embodiment of the disclosure. FIG. 5B is a schematic cross-sectional view taken along the line A-A' in FIG. 5A, and FIG. 5C is a schematic cross-sectional view taken along the line B-B' illustrated in FIG. 5A. FIG. 5D is a schematic cross-sectional view taken along the line C-C' illustrated in FIG. 5A.

In the photoelectric conversion apparatus according to the first exemplary embodiment, the reference pixel 20N is different in the structure below the N-type charge accumulation area 210 from the pixel according to the comparative example, compared to the unit pixel 20 and the OB pixel 20B. More specifically, as illustrated in FIG. 5B and FIG. 5D, the whole area where the N-type semiconductor area is provided in the structure according to the comparative example, below the depletion suppression area 211 is the P-type semiconductor area.

In other words, in the area below the depletion suppression area 211 of the reference pixel 20N, the effective P-type impurity concentration is high and the effective N-type impurity concentration is low as compared with the area below the depletion suppression area 211 in each of the unit pixel 20 and the OB pixel 20B. When a range from the light incident surface to the depletion suppression area 211 in each of the pixels is divided in parallel with the light incident surface, and the effective concentrations at positions of the same depth are compared, the effective P-type impurity concentration is high and the effective N-type impurity concentration is low in the reference pixel 20N as compared with the unit pixel 20 and the OB pixel 20B.

When the area below the depletion suppression area 211 is the P-type semiconductor area, it is possible to prevent generation of the excessive charges in the area. This thereby makes it possible to prevent the excessive charges from entering the adjacent OB pixel 20B, and to obtain a reference value of the black level in the OB pixel 20B more accurately. It is also possible to prevent the charges from entering from the reference pixel 20N to the unit pixel 20. This makes it possible to prevent deterioration of the accuracy of the signal output from the unit pixel 20. In the case where an image is generated by using the signal output from the photoelectric conversion apparatus, deterioration of image quality can be prevented.

The P-type semiconductor area below the depletion suppression area 211 may be formed by an ion implantation step same as an ion implantation step for the P-type pixel separation area separating adjacent pixels. Forming the P-type semiconductor area in the step same as the pixel separation area makes it possible to simplify the step. Further, in the present exemplary embodiment, the slit portion is not essential for the depletion suppression area 211 of the reference pixel 20N.

In the present exemplary embodiment, the case where the semiconductor area below the depletion suppression area 211 is the P-type semiconductor area is described. If such an area is formed as the N-type semiconductor area lower in concentration than the charge accumulation area 210 and a potential well to be formed is made shallow, it is also possible to reduce restraint of the charge movement caused by formation of the potential barrier at the slit portion.

In FIGS. 5A to 5D, a P-type counter area 214 is formed on the front surface side of the depletion suppression area 211 so as to be overlapped with the slit portion. Rectangular areas illustrated by dotted lines in FIG. 5A are each the counter area 214 described below.

At the slit portion of the depletion suppression area 211, a depletion voltage of the charge accumulation area 210 is locally increased and a potential groove is generated in some cases because the depletion suppression area 211 is not formed. In a case where the charges remain in the potential groove when the accumulated charges of the PD 201 are transferred to the FD 203 through the transfer transistor 202, image quality degradation, such as linearity deterioration or afterimage, may be caused.

In the present exemplary embodiment, the counter area 214 is formed on the front surface side of the depletion suppression area 211 so as to be overlapped with the slit portion in an upper surface view from the light incident direction, through ion implantation of the P-type impurity such as boron into the charge accumulation area 210. The counter area 214 raises the potential at a portion overlapped with the slit portion of the depletion suppression area 211, which suppresses local rise of the depletion voltage.

This facilitates the charge transfer from the PD 201 to the FD 203.

Further, as illustrated in FIG. 5A, the counter area 214 may extend in a direction opposite to the transfer transistor 202 relative to the slit portion of the depletion suppression area 211. An electric field by the transfer transistor 202 of the PD 201 is difficult to reach the area far from the transfer transistor 202, and movement of the charges is stagnated in some cases. The counter area 214 is made extended up to the PD area far from the transfer transistor 202 and the potential of the PD area is raised, which makes it possible to farther facilitate the charge transfer from the PD 201 to the FD 203.

The counter area 214 is formed not only in the unit pixel 20 but also in each of the OB pixel 20B and the reference pixel 20N. The counter area 214 is applicable to a photoelectric conversion apparatus according to a second exemplary embodiment described below, and to the photoelectric conversion apparatus according to the comparative example.

The second exemplary embodiment of the disclosure will be described with reference to FIGS. 6A to 6D. In the following description, description of parts overlapped with the description according to the first exemplary embodiment is omitted, and differences from the first exemplary embodiment are mainly described.

Figures 6A, 6B:
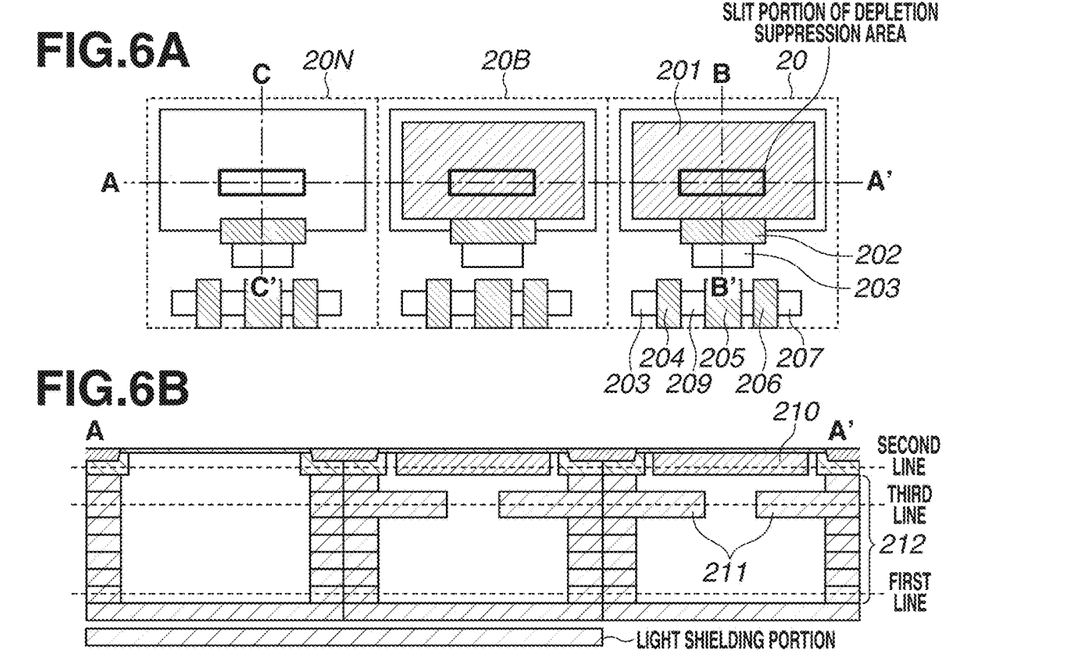
FIGS. 6A to 6D are a pixel plan view and cross-sectional views of a photoelectric conversion apparatus according to a second exemplary embodiment.
Figure 6C:
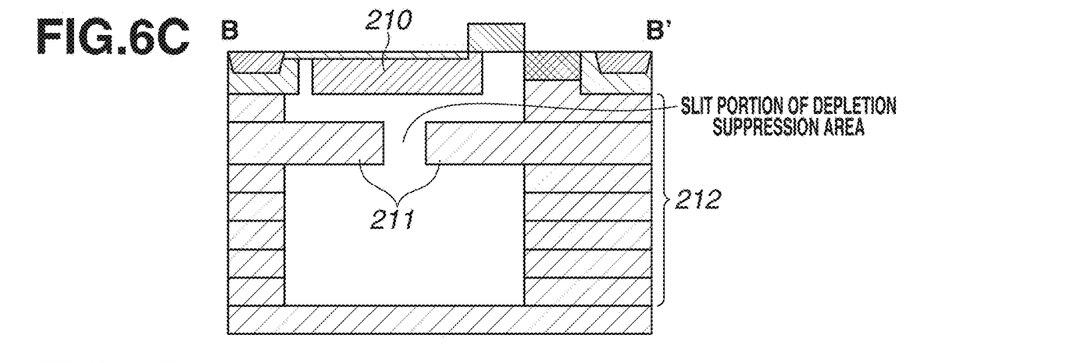
Figure 6D:
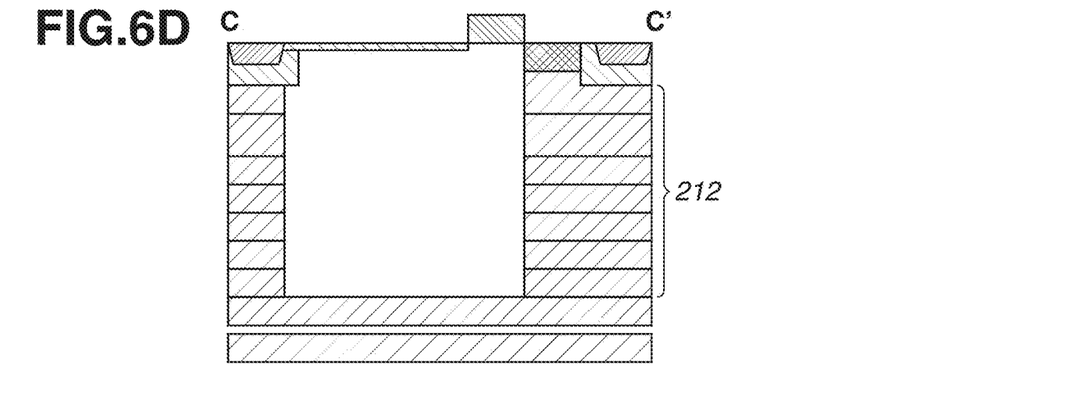

FIGS. 6A to 6D are a schematic plan view and schematic cross-sectional views of a unit pixel 20, an OB pixel 20B, and a reference pixel 20N of the photoelectric conversion apparatus according to the second exemplary embodiment of the disclosure. FIG. 6B is a schematic cross-sectional view taken along the line A-A' illustrated in FIG. 6A, and FIG. 6C is a schematic cross-sectional view taken along the line B-B' illustrated in FIG. 6A. Further, FIG. 6D is a schematic cross-sectional view taken along the line C-C' illustrated in FIG. 6A.

In the second exemplary embodiment, the reference pixel 20N is different in the structure below the charge accumulation area from the pixel according to the comparative example and the pixel of the photoelectric conversion apparatus according to the first exemplary embodiment, compared to the unit pixel 20 and the OB pixel 20B. More specifically, the reference pixel 20N is different in that the reference pixel 20N includes neither the charge accumulation area 210 nor the depletion suppression area 211, as illustrated in FIG. 6B and FIG. 6D. Alternatively, it can be considered that the slit portion in the depletion suppression area has a wide width nearly equal to a width of the cross-section of the reference pixel 20N.

Since the reference pixel 20N according to the present exemplary embodiment does not include the depletion suppression area 211, the slit portion of the depletion suppression area 211 is not present, and the potential barrier around the slit portion is not formed. Thus, when the transfer transistor 202 is turned on, a sufficient electric field is applied up to the light incident surface side of the reference pixel 20N, and the excessive charges can be discharged from the reference pixel 20N to the FD 203. This makes it possible to prevent the excessive charges from entering from the reference pixel 20N to the adjacent OB pixel 20B, and to obtain the reference value of the black level in the OB pixel 20B accurately. It is also possible to prevent the charges from entering from the reference pixel 20N to the unit pixel 20. It is possible to prevent deterioration of accuracy of the signal output from the unit pixel 20, accordingly. In a case where an image is generated by using the signal output from the photoelectric conversion apparatus, deterioration of image quality can be prevented.

Figure 7:
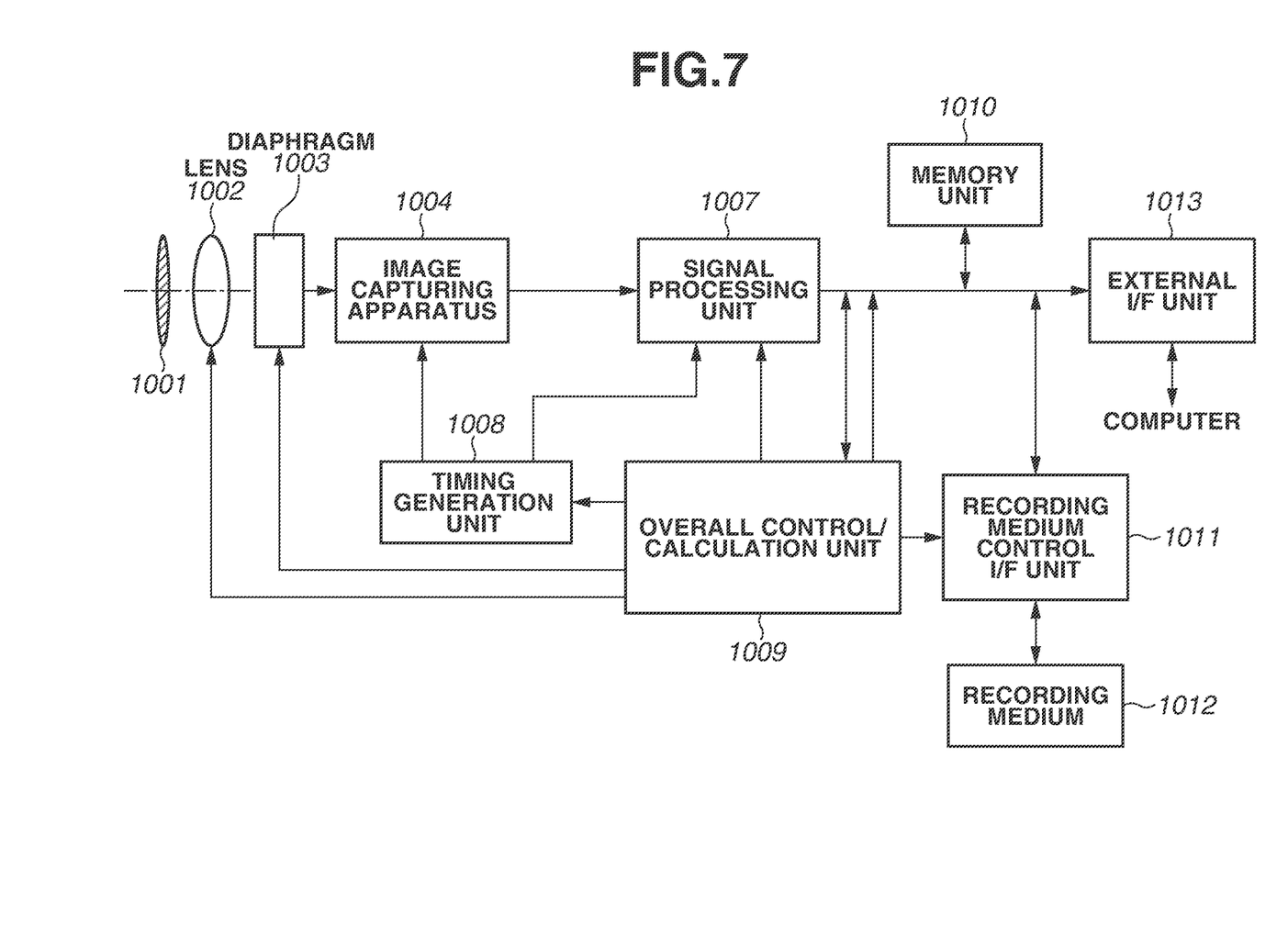
FIG. 7 is a diagram illustrating a configuration of a photoelectric conversion system according to a third exemplary embodiment.

A photoelectric conversion system according to a third exemplary embodiment will now be described with reference to FIG. 7. FIG. 7 is a block diagram illustrating a schematic configuration of the photoelectric conversion system according to the present exemplary embodiment.

The photoelectric conversion apparatus (image capturing apparatus) described in each of the above-described first and second exemplary embodiments is applicable to various photoelectric conversion systems. Examples of the applicable photoelectric conversion system include a digital still camera, a digital camcorder, a surveillance camera, a copier, a facsimile, a mobile phone, an on-vehicle camera, and an observation satellite. The examples also include a camera module having an optical system such as a lens and an image capturing apparatus. FIG. 7 is a block diagram of a digital still camera as an example among these apparatuses.

The photoelectric conversion system illustrated in FIG. 7 includes an image capturing apparatus 1004 as an example of the photoelectric conversion apparatus, and a lens 1002 forming an optical image of an object on the image capturing apparatus 1004. The photoelectric conversion system further includes a diaphragm 1003 varying a quantity of light passing through the lens 1002, and a barrier 1001 protecting the lens 1002. The lens 1002 and the diaphragm 1003 serve as an optical system collecting light to the image capturing apparatus 1004. The image capturing apparatus 1004 is the photoelectric conversion apparatus (image capturing apparatus) according to any of the above-described exemplary embodiments, and converts the optical image formed by the lens 1002 into an electric signal.

The photoelectric conversion system further includes a signal processing unit 1007 as an image generation unit that generates an image by processing an output signal output from the image capturing apparatus 1004. The signal processing unit 1007 performs various kinds of correction and compression as necessary, and outputs image data. The signal processing unit 1007 may be provided on a semiconductor substrate provided with the image capturing apparatus 1004, or may be provided on a semiconductor substrate different from the semiconductor substrate provided with the image capturing apparatus 1004.

The photoelectric conversion system further includes a memory unit 1010 temporarily storing the image data, and an external interface unit (external I/F unit) 1013 to communicate with an external computer and the like. The photoelectric conversion system further includes a recording medium 1012 such as a semiconductor memory, to/from which captured image data is recorded or read out, and a recording medium control interface unit (recording medium control I/F unit) 1011 to perform recording on or reading out from the recording medium 1012. The recording medium 1012 may be incorporated in the photoelectric conversion system or may be detachable.

The photoelectric conversion system further includes an overall control/calculation unit 1009 controlling various kinds of calculation and the entire digital still camera, and a timing generation unit 1008 outputting various kinds of timing signals to the image capturing apparatus 1004 and the signal processing unit 1007. The timing signals and the like may be input from outside. The photoelectric conversion system may include at least the image capturing apparatus 1004, and the signal processing unit 1007 for processing the output signal output from the image capturing apparatus 1004.

The image capturing apparatus 1004 outputs a captured image signal to the signal processing unit 1007. The signal processing unit 1007 performs predetermined signal processing on the captured image signal output from the image capturing apparatus 1004, and outputs image data. The signal processing unit 1007 generates an image by using the captured image signal.

As described above, according to the present exemplary embodiment, it is possible to realize the photoelectric conversion system adopting the photoelectric conversion apparatus (image capturing apparatus) according to any of the above-described exemplary embodiments.

Figure 8A:
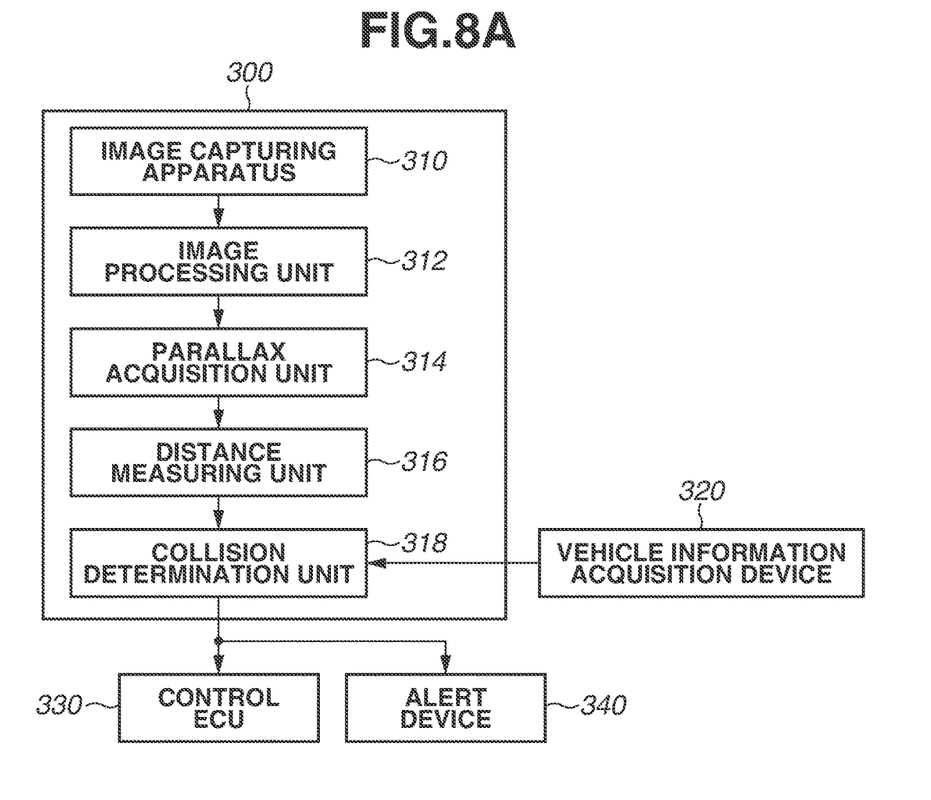
FIGS. 8A and 8B are diagrams illustrating a configuration and operation of a moving body according to a fourth exemplary embodiment.
Figure 8B:
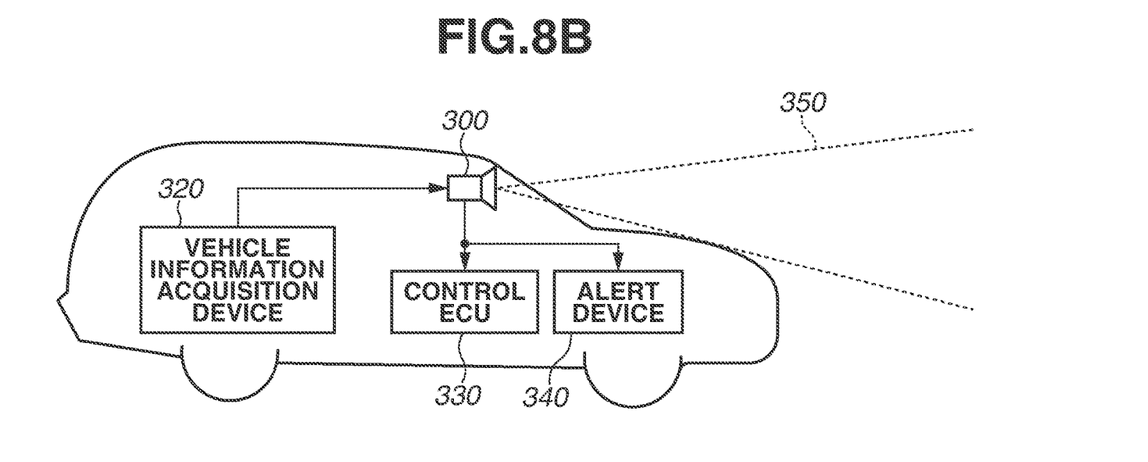

A photoelectric conversion system and a moving body according to a fourth exemplary embodiment will now be described with reference to FIGS. 8A and 8B. FIGS. 8A and 8B are diagrams illustrating configurations of a photoelectric conversion system and a moving body according to the present exemplary embodiment.

FIG. 8A illustrates an example of the photoelectric conversion system relating to an on-vehicle camera. A photoelectric conversion system 300 includes an image capturing apparatus 310. The image capturing apparatus 310 is a photoelectric conversion apparatus (image capturing apparatus) according to any of the above-described exemplary embodiments. The photoelectric conversion system 300 includes an image processing unit 312 and a parallax acquisition unit 314. The image processing unit 312 performs image processing on a plurality of pieces of image data acquired by the image capturing apparatus 310. The parallax acquisition unit 314 calculates parallax (phase difference between parallax images) from the plurality of pieces of image data acquired by the photoelectric conversion system 300. The photoelectric conversion system 300 further includes a distance measuring unit 316 calculating a distance to an object based on the calculated parallax, and a collision determination unit 318 determining collision possibility based on the calculated distance. The parallax acquisition unit 314 and the distance measuring unit 316 are examples of a distance information acquisition unit acquiring information on the distance to the object. In other words, the information on the distance is information about, for example, the parallax, a defocusing amount, and the distance to the object. The collision determination unit 318 may determine collision possibility by using any of the distance information. The distance information acquisition unit may be realized by hardware exclusively designed, or may be realized by a software module. Alternatively, the distance information acquisition unit may be realized by, for example, a field programmable gate array (FPGA), and an application specific integrated circuit (ASIC), or may be realized by a combination thereof.

The photoelectric conversion system 300 is connected to a vehicle information acquisition device 320, and acquires vehicle information, such as a vehicle speed, a yaw rate, and a steering angle. The photoelectric conversion system 300 is also connected to a control engine control unit (ECU) 330 that is a control unit outputting a control signal causing the vehicle to generate braking force, based on the determination result of the collision determination unit 318. The photoelectric conversion system 300 is also connected to an alert device 340 that issues an alert to a driver based on the determination result of the collision determination unit 318. For example, in a case where collision possibility is high as the determination result of the collision determination unit 318, the control ECU 330 performs vehicle control to avoid collision or reduce damage by, for example, applying a brake, releasing an accelerator, and suppressing an engine output. The alert device 340 issues an alert to the driver by, for example, sounding an alert such as sound, displaying alert information on a screen of a car navigation system, and vibrating a seat belt or a steering wheel.

In the present exemplary embodiment, the photoelectric conversion system 300 captures an image around the vehicle, for example, on a front side or a rear side. FIG. 8B illustrates the photoelectric conversion system 300 in a case where an image on the front side of the vehicle (image capturing range 350) is captured. The vehicle information acquisition device 320 sends an instruction to the photoelectric conversion system 300 or the image capturing apparatus 310. Such a configuration makes it possible to improve accuracy of ranging.

The example in which the control is performed so as to prevent collision with the other vehicle is described above;

however, the exemplary embodiment is applicable to, for example, automatic driving control for following another vehicle, and automatic driving control for not going out of a traffic lane. The photoelectric conversion system is also applicable to a moving body (moving apparatus) such as a vessel, an aircraft, and an industrial robot, without being limited to the vehicle such as an automobile. In addition, the photoelectric conversion system is widely applicable to an apparatus using object recognition technique, such as an intelligent transportation system (ITS), without being limited to moving bodies.

The disclosure is not limited to the above-described exemplary embodiments, and can be variously modified.

The exemplary embodiments according to the disclosure also include, for example, an example in which a part of the configuration of any of the exemplary embodiments is added to a configuration of another exemplary embodiment, and an example in which a part of the configuration of any of the exemplary embodiments is replaced with the configuration of another exemplary embodiment.

The photoelectric conversion system described in each of the above-described third and fourth exemplary embodiments is an example of the photoelectric conversion system to which the photoelectric conversion apparatus is applicable. The photoelectric conversion system to which the photoelectric conversion apparatus according to the aspect of the embodiments is applicable is not limited to the configuration illustrated in FIG. 7 and FIGS. 8A and 8B.

The first exemplary embodiment and the second exemplary embodiment are described by using the schematic diagram of the photoelectric conversion apparatus illustrated in FIG. 1; however, the disclosure may adopt a stacked-layer structure in which the circuits are disposed on two or more semiconductor substrates and these substrates are bonded. For example, the circuits are separately provided on two substrates, the pixel array 100 and the vertical scanning circuit 101 are disposed on a first substrate, and the column amplification circuit 102, the horizontal scanning circuit 103, and the control circuit 105 are disposed on a second substrate. This is an example of the arrangement and does not limit the technical range of the aspect of the embodiments. For example, the vertical scanning circuit 101 disposed on the first substrate may be disposed on the second substrate. Further, the unit pixels 20, in the example in FIG. 1, are electrically connected to the column amplification circuit 102 for each column of the unit pixels 20; however, for example, a signal amplification circuit may be connected to each of the pixels. Although the stacked-layer structure including the two substrates is described as an example, a stacked-layer structure including three or more substrates may be adopted by, for example, further separating the circuits or adding a circuit or a function.

The above-described exemplary embodiments are merely examples of embodiments for implementation of the disclosure, and the technical range of the aspect of the embodiments is not be construed to be limited thereby. In other words, the aspect of the embodiments can be implemented in various forms without departing from the technical idea or the main features of the disclosure.

According to the exemplary embodiments of the disclosure, it is possible to prevent deterioration of signal accuracy in the photoelectric conversion apparatus in which the pixel including the depletion suppression area is disposed in the effective pixel area.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-063491, filed Apr. 2, 2021, which is hereby incorporated by reference herein in its entirety.

What is claimed is:

1. An apparatus, comprising:
a plurality of pixels arranged on a substrate including a first surface provided with a transistor and a second surface opposed to the first surface; and
a light shielding portion configured to shield a part of the plurality of pixels from light,
wherein the plurality of pixels includes first pixels shielded from light by the light shielding portion, and second pixels,
wherein each of the plurality of pixels includes a first area of a first conductive type,
wherein each of the first pixels includes a second area,
wherein each of the second pixels includes a third area between the second surface and the first area, and includes a fourth area of a second conductive type between the first area and the first surface,
wherein a first line parallel to the second surface is defined at a position dividing each of the second area and the third area, between the second surface and the first area in each of the first and second pixels, and
wherein, in a cross-section along the first line, an impurity concentration of the first conductive type in the second area is higher than an impurity concentration of the first conductive type in the third area.

2. The apparatus according to claim 1, further comprising a pixel separation area of the first conductive type configured to separate the plurality of pixels from one another,
wherein the second area of each of the first pixels is formed in a step of forming the pixel separation area.

3. The apparatus according to claim 1, wherein, in the cross-section along the first line, the second area separates the plurality of pixels from one another.

4. The apparatus according to claim 1,
wherein each of the plurality of pixels includes a fifth area, and
wherein the first area includes a first end and a second end that faces the first end and is distanced by the fifth area.

5. An apparatus, comprising:
a plurality of pixels arranged in a substrate including a first surface provided with a transistor and a second surface opposed to the first surface; and
a light shielding portion configured to shield a part of the plurality of pixels from light,
wherein the plurality of pixels includes first pixels shielded from light by the light shielding portion, and second pixels,
wherein each of the plurality of pixels includes a first area of a first conductive type, and a fifth area,
wherein each of the first pixels includes a second area,
wherein each of the second pixels includes a third area and a fourth area,
wherein the first area includes a first end and a second end that faces the first end and is distanced by the fifth area,
wherein a first distance of the first area of each of the first pixels distanced by the fifth area is greater than a second distance of the first area of each of the second pixels distanced by the fifth area,
wherein a first line parallel to the second surface is defined at a position dividing each of the second area and the third area, between the second surface and the first area in each of the first and second pixels,
wherein a second line parallel to the second surface is defined at a position dividing each of the second area and the fourth area, between the first surface and the first area,
wherein a third line parallel to the second surface is defined at a position dividing each of the first area and the second area, between the first line and the second line,
wherein, in a cross-section along the first line, the second area and the third area are of a second conductive type,
wherein, in a cross-section along the second line, the second area and the fourth area are of the second conductive type, and
wherein, in a cross-section along the third line, the second area is of the second conductive type.

6. The apparatus according to claim 5, wherein an impurity concentration of the second conductive type in the fourth area is higher than an impurity concentration of the second conductive type in the second area.

7. The apparatus according to claim 1, wherein an impurity concentration of the second conductive type in the fourth area is higher than an impurity concentration of the second conductive type in the third area.

8. The apparatus according to claim 5, wherein an impurity concentration of the second conductive type in the fourth area is higher than an impurity concentration of the second conductive type in the third area.

9. The apparatus according to claim 1, wherein the second pixels each adjacent to any of the first pixels are shielded from light by the light shielding portion.

10. The apparatus according to claim 5, wherein the second pixels each adjacent to any of the first pixels are shielded from light by the light shielding portion.

11. The apparatus according to claim 1, wherein each of the plurality of pixels is a Back-side Illumination pixel.

12. A system, comprising:
the apparatus according to claim 1; and
a signal processing unit configured to process a signal output from the apparatus, to generate an image.

13. The system according to claim 12,
wherein the apparatus further comprises a pixel separation area of the first conductive type configured to separate the plurality of pixels from one another, and
wherein, in the apparatus, the second area of each of the first pixels is formed in a step of forming the pixel separation area.

14. The system according to claim 12, wherein, in the apparatus, in the cross-section along the first line, the second area separates the plurality of pixels from one another.

15. The system according to claim 12, wherein, in the apparatus, each of the plurality of pixels includes a fifth area, and the first area includes a first end and a second end that faces the first end and is distanced by the fifth area.

16. The system according to claim 12, wherein, in the apparatus, an impurity concentration of the second conductive type in the fourth area is higher than an impurity concentration of the second conductive type in the third area.

17. The system according to claim 12, wherein, in the apparatus, the second pixels each adjacent to any of the first pixels are shielded from light by the light shielding portion.

18. A moving body including the apparatus according to claim 1, the moving body comprising a control unit configured to control movement of the moving body by using a signal output from the apparatus.

19. A substrate to be stacked on another substrate, the substrate comprising:
a first surface provided with a transistor;
a second surface opposed to the first surface; and
a plurality of pixels,
wherein the plurality of pixels includes first pixels shielded from light by a light shielding portion, and second pixels,
wherein each of the plurality of pixels includes a first area of a first conductive type,
wherein each of the first pixels includes a second area,
wherein each of the second pixels includes a third area between the second surface and the first area, and includes a fourth area of a second conductive type between the first area and the first surface,
wherein a first line parallel to the second surface is defined at a position dividing each of the second area and the third area, between the second surface and the first area in each of the first and second pixels, and
wherein, in a cross-section along the first line, an impurity concentration of the first conductive type in the second area is higher than an impurity concentration of the first conductive type in the third area.

20. A substrate to be stacked on another substrate, the substrate comprising:
a first surface provided with a transistor;
a second surface opposed to the first surface; and
a plurality of pixels,
wherein the plurality of pixels includes first pixels shielded from light by a light shielding portion, and second pixels,
wherein each of the plurality of pixels includes a first area of a first conductive type, and a fifth area,
wherein each of the first pixels includes a second area,
wherein each of the second pixels includes a third area and a fourth area,
wherein the first area includes a first end and a second end that faces the first end and is distanced by the fifth area,
wherein a first distance of the first area of each of the first pixels distanced by the fifth area is greater than a second distance of the first area of each of the second pixels distanced by the fifth area,
wherein a first line parallel to the second surface is defined at a position dividing each of the second area and the third area, between the second surface and the first area in each of the first and second pixels,
wherein a second line parallel to the second surface is defined at a position dividing each of the second area and the fourth area, between the first surface and the first area,
wherein a third line parallel to the second surface is defined at a position dividing each of the first area and the second area, between the first line and the second line,
wherein, in a cross-section along the first line, the second area and the third area are of a second conductive type,
wherein, in a cross-section along the second line, the second area and the fourth area are of the second conductive type, and
wherein, in a cross-section along the third line, the second area is of the second conductive type.

* * * * *